(12) United States Patent
Permuy

(10) Patent No.: US 9,641,100 B2
(45) Date of Patent: May 2, 2017

(54) HIGH POWER CONVERTER COMPRISING LOW POWER SWITCHES AND A SWITCH CONTROL DEVICE FOR GENERATING A PULSE WITH A REFERENCE VALUE AND AT LEAST TWO CONTROL VALUES

(75) Inventor: Alfred Permuy, Rueil-Malmaison (FR)

(73) Assignee: GE ENERGY POWER CONVERSION TECHNOLOGY LTD., Warwickshire (GB)

( * ) Notice: Subject to any disclaimer, the term of this patent is extended or adjusted under 35 U.S.C. 154(b) by 123 days.

(21) Appl. No.: 14/342,296

(22) PCT Filed: Aug. 30, 2012

(86) PCT No.: PCT/EP2012/066917
§ 371 (c)(1),
(2), (4) Date: Feb. 28, 2014

(87) PCT Pub. No.: WO2013/030308
PCT Pub. Date: Mar. 7, 2013

(65) Prior Publication Data
US 2014/0369102 A1    Dec. 18, 2014

(30) Foreign Application Priority Data
Sep. 1, 2011   (FR) ..................... 11 57749

(51) Int. Cl.
*H02M 7/06* (2006.01)
*H02M 3/158* (2006.01)
(Continued)

(52) U.S. Cl.
CPC ............. *H02M 7/537* (2013.01); *H02M 1/08* (2013.01); *H02M 1/088* (2013.01);
(Continued)

(58) Field of Classification Search
CPC ........ H02M 1/08; H02M 1/084; H02M 1/088; H02M 1/096; H02M 1/10; H02M 3/22;
(Continued)

(56) References Cited

U.S. PATENT DOCUMENTS

| 4,370,607 A | 1/1983 | Dassonville |
| 5,089,719 A | 2/1992 | Kamei |

(Continued)

FOREIGN PATENT DOCUMENTS

| CN | 201063534 Y | 5/2008 |
| CN | 101214576 A | 7/2008 |
| CN | 102005908 A | 4/2011 |

OTHER PUBLICATIONS

PCT International Search Report from corresponding PCT Application No. PCT/EP12/066917, dated Jan. 16, 2013.
(Continued)

*Primary Examiner* — Jessica Han
*Assistant Examiner* — David A. Singh
(74) *Attorney, Agent, or Firm* — GE Global Patent Operation; Scott R. Stanley

(57) ABSTRACT

A system for converting a first voltage into a second voltage includes input terminals and output terminals, switching members disposed between the terminals which can convert voltage, and a device for controlling the switching members. The device includes a cell for controlling a switching member, and a member for managing and supplying the control cell. The member is connected to the control cell by a link allowing the simultaneous transmission of a control signal and electrical energy. The member includes a device for generating a pulse, and which includes at least two different control intervals.

14 Claims, 4 Drawing Sheets

(51) Int. Cl.
  *H02M 7/537* (2006.01)
  *H02M 1/088* (2006.01)
  *H03K 17/0412* (2006.01)
  *H02M 1/08* (2006.01)

(52) U.S. Cl.
  CPC . *H03K 17/04123* (2013.01); *H03K 17/04126* (2013.01); *H02M 3/1588* (2013.01); *H02M 7/06* (2013.01); *H02M 2003/1586* (2013.01)

(58) Field of Classification Search
  CPC .......... H02M 3/24; H02M 3/28; H02M 3/285; H02M 3/325; H02M 3/335; H02M 3/33507; H02M 3/33523; H02M 3/33553; H02M 3/33569; H02M 3/33576; H02M 7/42; H02M 7/44; H02M 7/48; H02M 7/483; H02M 7/493; H02M 7/53; H02M 7/537; H02M 7/5383; H02M 2007/4815; H02M 2007/4822; H02M 3/1588; H02M 2003/1586; H02M 7/06

USPC .................. 363/131, 132, 137; 323/271, 272
  See application file for complete search history.

(56) References Cited

U.S. PATENT DOCUMENTS 5,450,306 A * 9/1995 Garces et al. ........ H02M 5/458
  363/132
2010/0302820 A1 12/2010 Nakamura et al.

OTHER PUBLICATIONS

Unofficial English translation of Chinese Office Action issued in connection with corresponding CN Application No. 201280053892.0 on Dec. 28, 2015.

* cited by examiner

HIGH POWER CONVERTER COMPRISING LOW POWER SWITCHES AND A SWITCH CONTROL DEVICE FOR GENERATING A PULSE WITH A REFERENCE VALUE AND AT LEAST TWO CONTROL VALUES

FIELD OF THE INVENTION

Embodiments of the present invention relate to a system for the conversion of a first electrical voltage into a second electrical voltage and, in particular, to the conversion system with high electrical power, such as power in excess of 1 MW.

BACKGROUND OF THE INVENTION

A voltage converter of the aforementioned type is known. The converter is a three-phase voltage inverter comprising two input DC voltage terminals and one output terminal for each phase of the three-phase output voltage. The three-phase inverter includes two switching branches for each phase. Each switching branch is connected between the corresponding output terminal and a respective input terminal and includes a switching element. The switching elements are controlled by a control device and are suitable for converting the DC input voltage and the alternating output voltage. The switching elements include, for example, controllable electronic switches. The control device includes a cell controlling a switching element, and a control and supply unit for respective control cells. The control and supply unit is connected to the control cell by means of a connection for the simultaneous transmission of the corresponding control signal and the associated electrical energy. In this way, the energy is transferred at the same time as the control signals, which makes it possible to have a single connection between the control and supply unit and the respective control cells.

However, the time taken to establish a current between the control unit and the control cells is relatively long, and this is an increasing function of the number of control cells connected to the control and supply unit. The switching of the switches of a voltage converter of this kind is therefore relatively slow, which limits the frequency of the switching of the switches in the converter.

BRIEF SUMMARY OF THE INVENTION

Embodiments of the present invention propose a conversion system that makes it possible to accelerate the switching of the switching elements in order to increase the switching frequency of said switching elements and also to reduce possible timing discrepancies between the switchings of the switching elements.

A system for the conversion of a first electrical voltage into a second electric voltage, the system comprising: at least two input and two output terminals, switching elements positioned between the input terminals and the output terminals that are suitable for converting the first voltage into the second voltage, and a control device for the switching elements, the switching device including a cell controlling a respective switching element and a control and supply unit for the control cell, the control and supply unit being connected to the control cell by means of a link for the simultaneous transmission of a control signal and electrical energy.

For this purpose, an embodiment of the present invention is a conversion system of the aforementioned type, characterised in that the control and supply unit includes means of generating a pulse comprising at least two distinct control slots, the pulse having a substantially constant value during the second control slot distinct from a reference value corresponding to the absence of control, the value of the pulse being distinct from one control slot to the other and the pulse having a value during the first control slot that is strictly greater than that during the second control slot.

Embodiments of the present invention includes one or more of the following features, taken in isolation or in accordance with all the technically possible combinations: the control slots for the same pulse follow each other in succession, the system comprises at least one group of switching elements connected in series, the group or each group being connected between corresponding output and input terminals, a respective control cell being associated with each switching element, and the control and supply unit is unique for the control cells of the switching elements in the same group, and is suitable for controlling the plurality of control cells in the switching elements in the group, the control device also includes means of electrical insulation arranged between each control cell and the control and supply unit, the electrical insulation means include, for each group of switching elements, a plurality of secondary windings, a plurality of magnetic circuits and a single primary winding, each secondary winding being electrically connected to the input of a respective control cell and wound around a respective magnetic circuit, the single primary winding being wound around each of the circuits and electrically connected to the output of the single control and supply unit, the single primary winding comprises a single turn passing through each of the corresponding magnetic circuits, the pulse comprises a first control slot and a second control slot, the value of the pulse during the first slot being at least twice as great as that during the second slot, the duration of the first control slot is between 50 ns and 200 ns, more particularly equal to 100 ns, the value U2 of the pulse during the second slot satisfies the following equation:

$$U2 = (N \times Uc)/M \qquad (1)$$

where N represents the number of switching elements of the corresponding group, N being an integer equal to or greater than 2, Uc is the input voltage of the corresponding control cell, and M represents the number of turns on the corresponding secondary winding, each control cell includes a first branch and a second branch connected in parallel, each branch comprising a transistor and a diode connected in series, the transistor of the second branch being complementary to that of the first branch, and the diode of the second branch being connected in an opposite direction compared with that of the first branch, and the means of generation of a pulse comprise an output terminal for the delivery of the pulse, and a first branch and a second branch connected to the output terminal, each branch comprising a transistor connected between a reference point and the output terminal, a resistor connected between the reference point and a first potential, a diode connected between the reference point and a second potential, and a capacitor connected between the reference point and an electrical earth, the transistor of the second branch being complementary to that of the first branch, and the diode of the second branch being connected in the opposite direction compared with that of the first branch.

BRIEF DESCRIPTION OF THE DRAWINGS

These features and advantages of the present invention will become apparent when reading the description which will follow, which is given solely as example, and refers to the attached drawings, of which.

DETAILED DESCRIPTION

An embodiment of the present invention relates to a system 10 for conversion of a first electrical voltage into a second electrical voltage comprising at least two input terminals 12 and at least two output terminals 14. The conversion system 10 comprises switching elements 16 positioned between the input terminals 12 and the output terminals 14, which are suitable for the conversion of the first voltage into the second voltage.

The conversion system is suitable for allowing the circulation of a high electrical power, for example higher than 1 MW.

Figure 1:
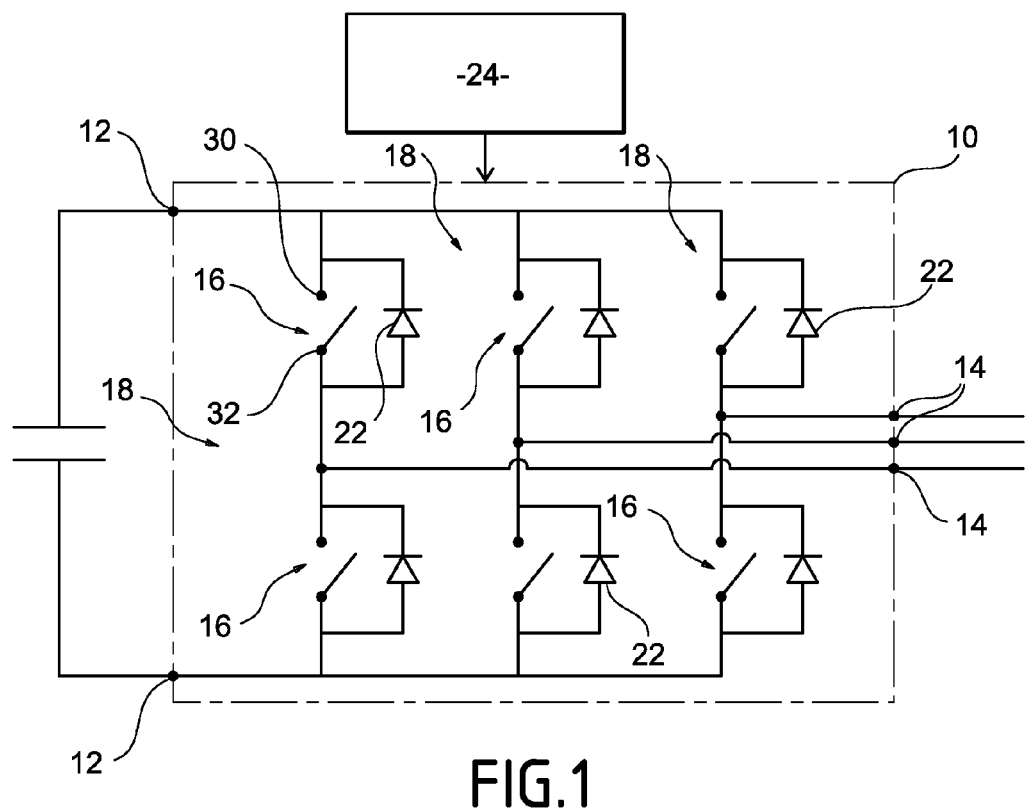
FIG. 1 is a schematic representation of a conversion system in accordance with an embodiment of the present invention, comprising six switching elements suited to converting the input voltage into an output voltage.

In the execution example in FIG. 1, the conversion system 10 is a voltage inverter suitable for converting a DC input voltage received between the two input terminals 12 into an alternating output voltage delivered at each output terminal 14.

The voltage inverter 10 comprises two switching branches 18 for each phase of the alternating output voltage, each switching branch 18 being connected between the corresponding output terminal 14 and a respective input terminal 12, and including a switching element 16.

The voltage inverter comprises a diode 22 connected in antiparallel with each switching element 16 and means 24 of controlling the switching elements.

In the example embodiment in FIG. 1, the voltage inverter 10 is a three-phase inverter 10 and includes three output terminals 14 and six switching branches 18, namely an output terminal and two switching branches for each phase of the three-phase output voltage.

Figure 2:
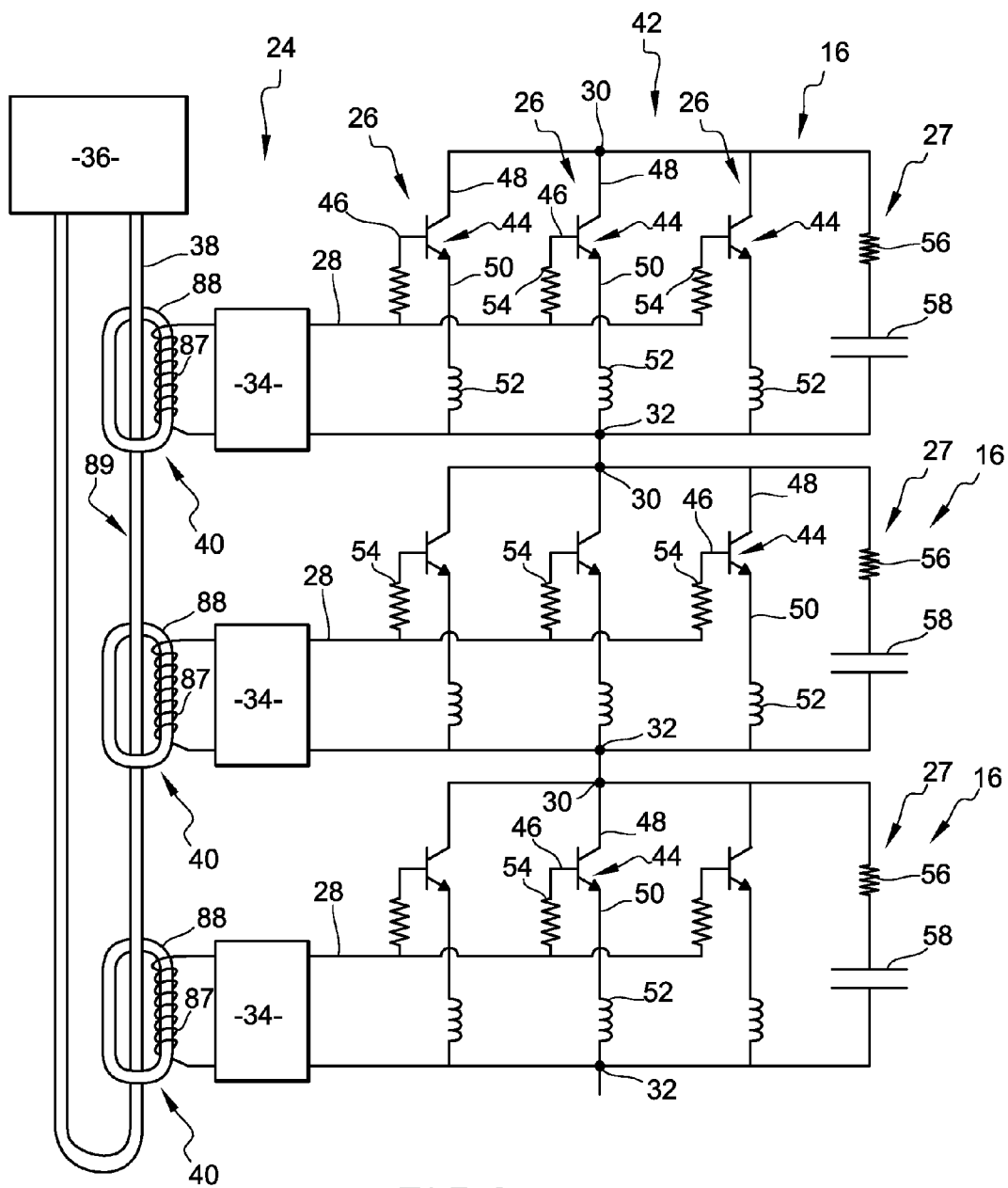
FIG. 2 is an electrical diagram of a group of switching elements and of a control device for the switching elements, the control device comprising a control cell for each respective switching element, and a control and supply unit for the control cells.

The switching element 16, visible on FIG. 2, comprises at least two arms 26 connected in parallel, a common control terminal 28, a first common conduction terminal 30 and a second common conduction terminal 32.

In the example embodiment in FIG. 2, the switching element 16 comprises three arms 26 connected in parallel.

In the example embodiment in FIGS. 1 and 2, each switching element 16 comprises at least two arms 26 connected in parallel, more particularly three arms 26 connected in parallel.

In addition, each switching element 16 comprises an additional arm 27 connected in parallel with the arms 26.

The control device 24, visible in FIG. 2, comprises a control cell 34 for each respective switching element 16 and a control and supply unit 36 for the control cells 34, the control and supply unit 36 being connected to the or each control cell 34 by a connection 38 for the simultaneous transmission of a control signal and electrical energy.

In addition, the control device 24 includes electrical insulation means 40 arranged between each control cell 34 and the control and supply unit 36.

In the example embodiment in FIG. 2, a group 42 of switching elements 16 connected in series comprises three switching elements 16, the group 42 being connected between an output terminal and a corresponding input terminal. A respective control cell 34 is associated with each switching element 16, and there is a single control and supply unit 36 for the three control cells 34 of the switching elements in the group 42.

Each arm 26 is connected between the first and second common conduction terminals 30, 32 and includes an electronic switch 44 controllable between an on and off state, the switch 44 comprising a control electrode 46, a first conduction electrode 48 and a second conduction electrode 50.

Each arm 26 also comprises an inductor 52 connected between the same electrode of the two electrodes of conduction 48, 50 and the corresponding common conduction terminal 30, 32.

In addition, each arm 26 comprises a resistor 54 connected between the control electrode 46 and the common control terminal 28.

The additional arm 27 comprises a resistor 56 and a capacitor 58 connected in series.

The common control terminal 28 is connected, for example, by means of the resistor 54, to the control electrode 46 of the switch of each of the arms 26 connected in parallel.

The first common conduction terminal 30 is connected to the first conduction electrode 48 of the switch of each of the arms 26 connected in parallel.

The second common conduction terminal 32 is connected by means of the inductor 52 to the second conduction electrode 50 of the switch of each arm 26 connected in parallel.

Figure 3:
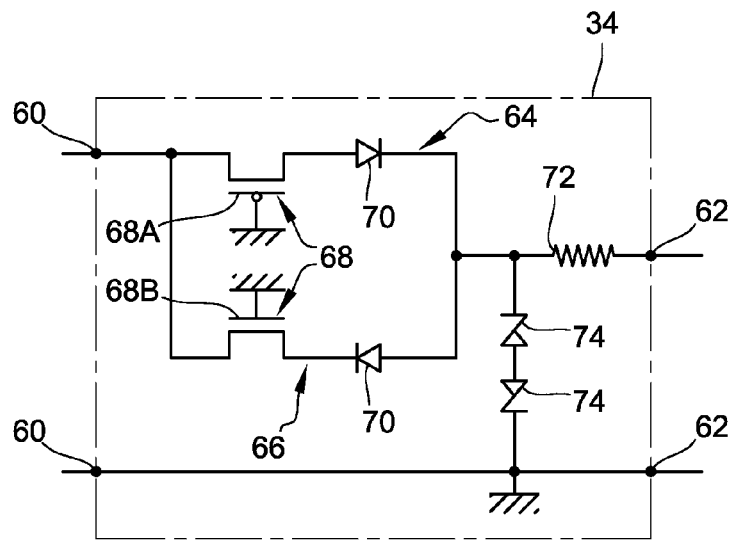
FIG. 3 is an electrical diagram of the control cell of FIG. 2.

Each control cell 34, visible in FIG. 3, comprises two input terminals 60 connected to the insulation means 40 and two output terminals 62 respectively connected to the common control terminal 28 and to the second common conduction terminal 32.

Each control cell 34 includes a first branch 64 and a second branch 66 connected in parallel, each branch 64, 66 comprising one transistor 68 and one diode 70 connected in series.

Each control cell 34 also comprises a resistor 72 connected between the branches 64, 66 and the output terminal 62, which is intended to be connected to the common control terminal 28. Each control cell 34 comprises two Zener diodes 74 connected in series and head to tail between the terminal of the resistor 72, which is not connected to the output terminal 62 and the other output terminal 62.

Figure 4:
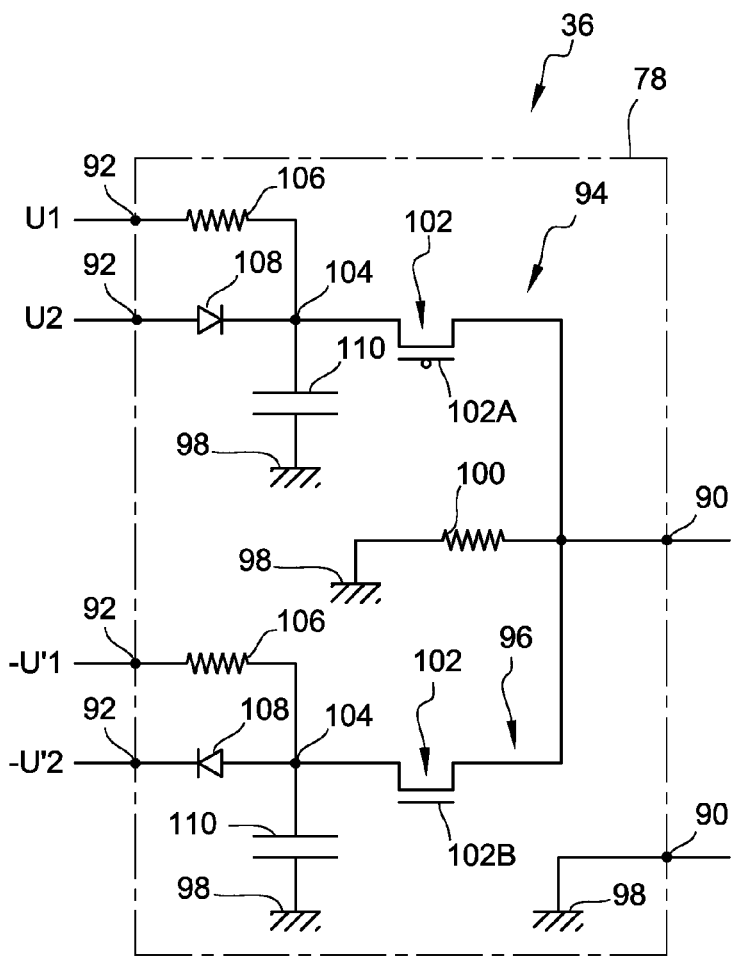
FIG. 4 is an electrical diagram of the control and supply unit of FIG. 2.
Figure 5:
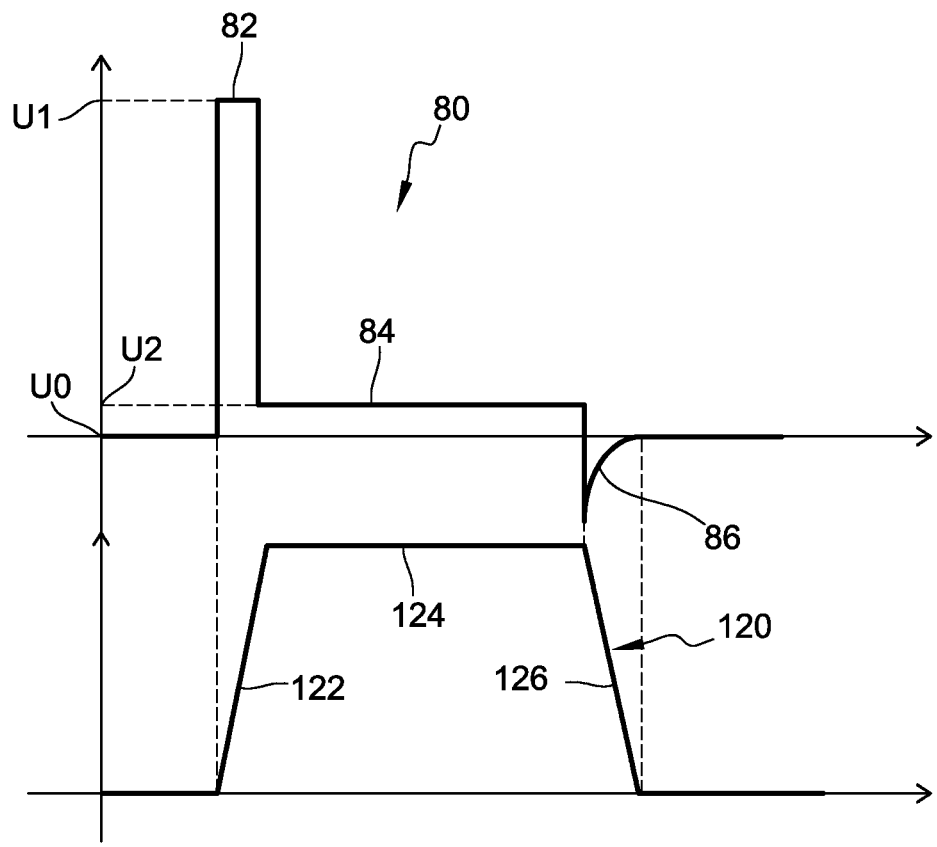
FIG. 5 is a set of curves representing on the one hand the voltage pulse generated by the control and supply unit intended for the control cells, and on the other hand, the current circulating in the connection between the control cells.

The control and supply unit 36 comprises means 78, visible in FIG. 4, of generating a pulse 80, visible in FIG. 5, the pulse 80 comprising a first 82 and a second 84 distinct control slot and one transition slot 86, the pulse 80 having during the second control slot 84 a substantially constant value U2 distinct from a reference value U0 corresponding to the absence of control, the value of the pulse being distinct from one control slot to the other. During the first control slot 82, the pulse 80 has a value U1 that is strictly greater than the value U2 of the pulse during the second control slot 84.

The control and supply unit 36 is suitable for controlling the plurality of control cells 34 of the switching elements 16 in the group 42.

The transmission connection 38 is a wired connection.

The electrical insulation means 40 include, for each group of switching units 42, a plurality of secondary windings 87, a plurality of magnetic circuits 88, and a single primary winding 89, each secondary winding 87 being electrically connected to the input of a respective control cell 34 and wound around a respective magnetic circuit 88. The single primary winding 89 is wound around each of the circuits 88 and electrically connected to the output of the single control and supply unit 36.

The electronic switch 44 comprises at least one transistor from the group consisting of: a field-effect transistor, an IGBT transistor (insulated gate bipolar transistor) and an IEGT transistor (injection enhanced gate transistor). In the example embodiment in FIG. 2, each electronic switch 44 consists of an IGBT transistor.

The or each transistor in the switch 44 is, for example, suitable for allowing the circulation of a current with a voltage equal to 1.2 kV or 600 V and an intensity equal to 30 or 40 A.

The switches in the same switching element 16 comprise transistors of the same type, namely field-effect transistors, IGBT transistors, or IEGT transistors. The transistors of the same switching element 16, although of the same type, are likely to display electrical characteristics that are substantially different from one transistor to another.

The control electrode 46 is also called the gate electrode when the switch 44 includes a field-effect transistor, an IGBT transistor or an IEGT transistor.

The first conduction electrode 48 and the second conduction electrode 50 are also referred to as collector electrode and emitter electrode respectively when the switch 44 includes an IGBT transistor or IEGT transistor.

In a variant, the first conduction electrode 48 and the second conduction electrode 50 are also referred to as the drain electrode and source electrode respectively, when the switch 44 comprises a field-effect transistor.

In the example embodiment in FIG. 2, said electrode among the two conduction electrodes 48, 50 which is connected to the inductor 52 is the second conduction electrode 50. In other words, said electrode among the two conduction electrodes which is connected to the inductor 52 is the emitter electrode when the transistor is an IGBT transistor or an IEGT transistor. In a variant, said electrode among the two conduction electrodes which is connected to the inductor 52 is the source electrode when the transistor is a field-effect transistor.

The inductor 52 has an L value greater than 10 nH and is substantially identical for each of the arms 26 connected in parallel. The inductor 52, for example, has an L value of between 10 nH and 100 nH.

The resistor 54 is a dedicated passive component and has value of approximately a few ohms.

The resistor 56 of the additional arm 27 is a damping resistor for the parasitic voltages liable to appear at high frequency, for example for frequencies greater than 1 MHz. The resistor 56 has an impedance of approximately a few ohms. The capacitor 58 is suited to absorbing a major portion of the current and to limiting the drift in the voltage over time. The capacitor 58 has a capacitance with a value of for example between P and 10×P nF, more particularly equal to 5×P nF, where P represents the number of arms 26 connected in parallel. Each capacitor 58 is able to charge when the switches 44 of each switching element are off, and to discharge when the switches 44 are on. The transistor 68 of the second branch 66, also denoted 68B, is complementary to that of the first branch 64, also denoted 68A. The diode 70 of the second branch 66 is connected in the opposite direction to that of the first branch 64.

The transistor 68A of the first branch is a p-type MOSFET transistor, and the transistor 68B of the second branch is an n-type MOSFET transistor. In a variant, the transistor 68A of the first branch is an npn-type bipolar transistor, and the transistor 68B of the second branch is a pnp-type bipolar transistor.

The generation means 78, visible in FIG. 4, comprise two output terminals 90 connected to the two ends of the transmission connection 38 for the delivery of the pulse 80, and input terminals 92 connected to potentials of predetermined values.

The generation means 78 comprise a first branch 94 and a second branch 96 connected to the same output terminal 90, the other output terminal 90 being connected to the electrical earth 98. The generation means 78 also comprise a resistor 100 connected between the output terminal connected to the first and second branches 94, 96 and the electrical earth 98. The pulse 80, visible in FIG. 5, generated by the generation means 78 comprises the first control slot 82, the second control slot 84 and the transition slot 86. In the example embodiment in FIG. 5, the pulse 80 is a voltage pulse and the current circulating in the wired transmission connection 38 corresponding to this pulse 80 is represented by the curve 120 visible in FIG. 5. The current in the wired transmission connection 38 therefore comprises a rising edge 122 corresponding to the first control slot 82, a plateau 124 where the current has a substantially constant value that corresponds to the second control slot 84. The current in the wired connection 38 finally has a falling edge 126 corresponding to the transition slot 86 of the pulse.

The value U2 of the pulse 80 during the second control slot 84 satisfies the following equation: $U2=(N \times Uc)/M$, where N represents the number of switching elements 16 of the corresponding group 42, N being an integer equal to or higher than 2, Uc is the voltage at the input of the corresponding control cell 34, and M represents the corresponding number of secondary winding turns 87. The duration of first slot 82 is between 50 ns and 200 ns, more particularly substantially equal to 100 ns. The duration of second slot 84 is between 0.2 ns and 3 ns, more particularly substantially equal to 1 ns.

The transition slot 86 begins with the opening of the branch 94, the current imposed by the secondary windings 87 then circulating in the resistor 100 connected between the output terminal 90 and the electrical earth 98. During the transition slot 86, the voltage of the pulse 80 falls to a minimum voltage with a value greater than or equal to a value −U'1, and then gradually decays. The magnetic circuit 88, for example, is toroidal.

In the example embodiment in FIG. 2, the single primary winding 89 comprises a single turn passing through each of the corresponding rings 88. In other words, the wired transmission connection 38 forms the single primary winding 89.

Each branch 94 or 96 comprises a transistor 102 connected between a reference point 104 and the corresponding output terminal 90, a resistor 106 connected between the reference point 104 and an input terminal 92 connected to a first potential with a value of U1 or U'1 respectively, a diode 108 connected between the reference point 104 and another input terminal 92 connected to a second potential with a value of U2 or U'2 respectively, and a capacitor 110 connected between the reference point 104 and the electrical earth 98.

The value U1, −U'1 of the first potential is higher in absolute value than that U2, −U'2 of the second potential. The values U1, U2 corresponding to the first branch are positive, and those corresponding to the second branch 96 are negative. Otherwise, the value U1 is higher than U2, which itself is higher than −U'2, which is itself higher than −U'1.

The transistor 102 of the first branch 94, also denoted 102A, is complementary to that of the second branch 96, also denoted 102B. The diode 108 of the second branch 96 is connected in the opposite direction to that of the first branch 94.

The transistor 102A of the first branch is a p-type MOSFET transistor, and the transistor 102B of the second branch is an n-type MOSFET transistor. In a variant, the transistor 102A of the first branch is an npn-type bipolar transistor, and the transistor 102B of the second branch is a pnp-type bipolar transistor.

During the operation of the conversion system, the control pulse 80 is generated by the control and supply unit 36 on the wired transmission connection 38, which has an inductance which is added to the parasitic inductance of the toroid 88. In other words, the primary winding 89 formed by the wired connection 38 and comprising a single turn has a high leakage inductance liable to result in an increase in the time taken to establish the current.

The pulse 80 generated by the control and supply unit 36 comprises the first high voltage control slot 82 to allow the establishment of current for a short duration (rising edge 122), the second slot 84 of relatively long duration corresponding to the maintenance of the current (plateau 124) and finally the parasitic slot 86 corresponding to the return of the current to a zero value (falling edge 126).

The two successive first slots 82, 84 make it possible to control the switching element 16, for example, in switched-on mode in the example embodiment in FIG. 5.

In addition, the pulse 80 also includes three slots, not shown, with voltages with a sign opposite to those previously described for the control of the switching element 16 in off mode. In other words, the pulse 80 for the control of the switching element 16 in off mode has the value −U'1 during the first control slot, then the value −U'2 during the second control slot. During the transition slot, the voltage of the pulse 80 increases up to a maximum voltage with a value lower than or equal to U1, then gradually decays.

When the pulse 80 has positive control slots 82, 84, the p-type transistor 68A of the first branch of the control cell 34 is on, while the n-type transistor 68B of the second branch of the control cell is off. The current then passes through the first branch 64 of the control cell to the control electrodes 46 of the switches 44, which turns on the switches 44. At the end of pulse 80, the n-type transistor 68B remains off, which makes it possible to keep the control electrode 46 in a charged state.

The operation is reversed for the control of the switching element 16 in its off mode. More precisely, the control slots, not shown, of the pulse 80 have successive negative voltages, and the n-type transistor 68B of the control cell 34 is on, while the p-type transistor 68A of the same control cell is off. The current circulates from the output 62 of the control cell to the corresponding input terminal 60. In other words, the control electrode 46 of the switches 44 does not receive any further control current, and the switches 44 are then in off mode.

A person skilled in the art will also understand that several positive pulses 80 can be successively generated in order to maintain the control signal on the control electrodes 46 of the switches for a relatively long duration.

The connection in series of the switching elements to form a group of elements 42 makes it possible to obtain an output voltage of a higher value, while limiting imbalances in voltage between the switching elements connected in series, the drift over time of the voltage at the terminal of each switching element 16 being controlled via the value of the capacitance of each capacitor 58.

It will thus be understood that the conversion system 10 according to embodiments of the present invention makes it possible to accelerate the switching of the switch elements in order to increase the switching frequency of these switching elements and also to reduce possible timing discrepancies between the switching of the switching elements.

This written description uses examples to disclose the various embodiments, including the best mode, and also to enable any person skilled in the art to practice the embodiments, including making and using any devices or systems and performing any incorporated methods. The patentable scope of the embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for the conversion of a first electric voltage into a second electric voltage, the system comprising:
    at least two input voltage terminals;
    at least two output voltage terminals;
    switching elements connected in series between the at least two input terminals and the at least two output terminals to form a group of switching elements, the switching elements configured to convert the first voltage into the second voltage; and
    a control device to control the switching elements, wherein the control device includes:
    control cells for the switching elements;
    a control and supply unit connected to the control cells to control the control cells, the control and supply unit having a generator configured to generate a control pulse to control the switching elements, the pulse having a first voltage control slot to allow establishment of current, a second voltage slot corresponding to maintenance of the current, and a third voltage control slot corresponding to a return of the current to a zero value;
    a transmission connection element connected between the control cells and the control and supply unit to permit a simultaneous transmission of the control pulse and electrical energy from the control and supply unit to the switching elements; and
    an electrical insulator arranged between a corresponding one of the control cells and the control and supply unit, the electrical insulator including a single primary winding, a plurality of secondary windings, and a plurality of magnetic circuits.

2. The system according to claim 1, wherein the transmission connection element comprises the single primary winding.

3. The system according to claim 2, wherein each secondary winding is electrically connected to an input of a corresponding control cell, and wound around a corresponding magnetic circuit.

4. The system according to claim 2, wherein the single primary winding passes through the magnetic circuits and electrically connected to an output of the control and supply unit.

5. The system according to claim 1, wherein a first value of the control pulse during the first voltage control slot is at least twice as great as a second value of the control pulse during the second voltage control slot.

6. The system according to claim 5, wherein the second value satisfies the following equation:

$$U2=(N \times Uc)/M,$$

where U2 represents the second value, N represents the number of switching elements of the corresponding group, N being an integer equal to or greater than 2, Uc is the input voltage of the corresponding control cell, and M represents a number of corresponding turns of the secondary windings.

7. The system according to claim 1, wherein a duration of the first control slot is between 50 ns and 200 ns.

8. A system for the conversion of a first electric voltage into a second electric voltage, the system comprising:
   switching elements connected in series to form a group of switching elements, the switching elements configured to convert the first voltage into the second voltage; and
   a control device to control the switching elements, wherein the control device includes:
   control cells for the switching elements;
   a control and supply unit connected to the control cells to control the control cells, the control and supply unit having a generator configured to generate a control pulse to control the switching elements, the pulse having a first voltage control slot to allow establishment of current, a second voltage slot corresponding to maintenance of the current, and a third voltage control slot corresponding to a return of the current to a zero value;
   a transmission connection element connected between the control cells and the control and supply unit to permit a simultaneous transmission of the control pulse and electrical energy from the control and supply unit to the switching elements; and
   an electrical insulator arranged between a corresponding one of the control cells and the control and supply unit, the electrical insulator including a single primary winding, a plurality of secondary windings, and a plurality of magnetic circuits.

9. The system according to claim 8, wherein the transmission connection element comprises the single primary winding.

10. The system according to claim 9, wherein each secondary winding is electrically connected to an input of a corresponding control cell, and wound around a corresponding magnetic circuit.

11. The system according to claim 9, wherein the single primary winding passes through the magnetic circuits and electrically connected to an output of the control and supply unit.

12. The system according to claim 8, wherein a first value of the control pulse during the first voltage control slot is at least twice as great as a second value of the control pulse during the second voltage control slot.

13. The system according to claim 12, wherein the second value satisfies the following equation:

$$U2=(N \times Uc)/M,$$

where U2 represents the second value, N represents the number of switching elements of the corresponding group, N being an integer equal to or greater than 2, Uc is the input voltage of the corresponding control cell, and M represents a number of corresponding turns of the secondary windings.

14. A system for the conversion of a first electric voltage into a second electric voltage, the system comprising:
   switching elements to convert the first voltage into the second voltage; and
   a control device to control the switching elements, wherein the control device includes:
   control cells for the switching elements; and
   a control and supply unit connected to the control cells to control the control cells, the control and supply unit having a generator configured to generate a control pulse to control the switching elements, the pulse having a first voltage control slot to allow establishment of current, a second voltage slot corresponding to maintenance of the current, and a third voltage control slot corresponding to a return of the current to a zero value;
   an electrical insulator arranged between the control cells and the control and supply unit, the electric insulator including a single primary winding connected between the control cells and the control and supply unit to permit a simultaneous transmission of the control pulse and electrical energy from the control and supply unit to the switching elements, a plurality of secondary windings, and a plurality of magnetic circuits through which the single primary winding passes through.

* * * * *